United States Patent [19]

Hofer

[11] 4,382,233
[45] May 3, 1983

[54] MULTIPLE-FEEDBACK PATH FILTER

[75] Inventor: Bruce E. Hofer, Beaverton, Oreg.

[73] Assignee: Tektronix, Inc., Beaverton, Oreg.

[21] Appl. No.: 206,114

[22] Filed: Nov. 12, 1980

[51] Int. Cl.³ .............................................. H03F 1/34
[52] U.S. Cl. .................................... 330/107; 330/109; 330/126
[58] Field of Search ............... 330/107, 109, 126, 294; 328/167

[56] References Cited
U.S. PATENT DOCUMENTS 3,743,957  7/1973  Feistel ............................ 330/107 X Primary Examiner—James B. Mullins
Attorney, Agent, or Firm—George T. Noe

[57] ABSTRACT

A multiple-feedback path bandpass/bandreject filter which exhibits a nearly constant Q over a predetermined frequency range, and which is tunable by means of a single variable impedance element is provided. A Thevenin equivalent voltage source is placed in series with the tuning element, wherein the Thevenin voltage is a predetermined constant fractional amplitude of the bandreject output voltage, or its equivalent.

4 Claims, 8 Drawing Figures

MULTIPLE-FEEDBACK PATH FILTER

BACKGROUND OF THE INVENTION

The present invention relates to tunable bandpass-bandreject filters in general, and in particular to a multiple-feedback-path filter having a single variable tuning element and exhibiting little change in Q (quality factor) over a predetermined frequency range.

Multiple-feedback-path filters are well known in the art, and are used in a variety of active filter applications, including bandpass and bandreject (notch) functions. One of the more widely used multiple-feedback-path filters is the tunable active RC filter because a good Q may be achieved and maintained constant over a broad frequency range. Since the Q of a filter is a function of the frequency and the passive resistive (R) and capacitance (C) elements, however, constant-Q performance has previously required two or more ganged variable elements.

SUMMARY OF THE INVENTION

In accordance with the present invention, a multiple-feedback-path bandpass/bandreject filter which exhibits good Q over a broad frequency range and is tunable by means of a single variable impedance element is provided. A nearly constant Q is achieved by placing a Thevenin equivalent voltage source in series with the variable impedance tuning element, wherein the Thevenin equivalent voltage source is a predetermined constant fractional amplitude of the bandreject output voltage, or its equivalent.

In a preferred embodiment of the present invention, a conventional active RC filter has a single tuning resistor, one end of which is connected to a voltage source derived from a combination of the input signal voltage, the bandpass filter output voltage.

It is therefore one object of the present invention to provide an improved multiple-feedback-path bandpass/bandreject filter which exhibits a nearly constant Q over a predetermined frequency range, and is tunable by means of a single variable impedance element.

It is another object of the present invention to connect one end of a tuning resistor of an active RC filter to a Thevenin equivalent voltage source of some constant fractional amplitude of the filter bandreject output voltage.

Further objects, features, and advantages will be apparent to those skilled in the art from consideration of the following description taken in conjunction with the accompanying drawings.

DETAILED DESCRIPTION OF THE INVENTION

Figure 1:
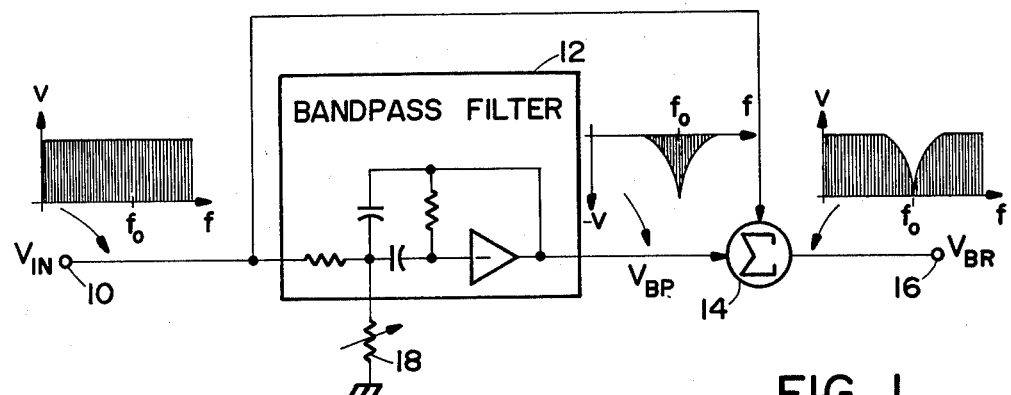
FIG. 1 shows a detailed block diagram of a conventional bandpass/bandreject filter as known in the prior art.

Turning now to the drawings, there is shown in FIG. 1 a detailed block diagram of a conventional bandpass/reject filter wherein an input signal $V_{IN}$ is applied via an input terminal 10 to a bandpass filter 12 and a summing device 14. The bandpass filter 12, which is an active RC filter comprising an operational amplifier having multiple feedback paths, inverts the signal and passes a portion thereof centered about a frequency $f_0$. For the purposes of this discussion, the bandpass filter output signal is designated $V_{BP}$. The bandpass filter output signal $V_{BP}$ is algebraically summed with the input signal $V_{IN}$ in the summing device 14 to produce a bandreject output signal $V_{BR}$, which is made available at an output terminal 16.

Filter theory is academic and it is well known that filter selectivity (and hence the width of the passband centered at $f_0$) depends upon the Q, or quality factor, which in turn is a function of the frequency and the passive R and C impedance elements in the multiple feedback paths. The filter 12 may be tuned to any particular center frequency $f_0$ by means of a single variable-impedance tuning element, such as variable resistor 18, which is connected between a summing node and ground. The effect on circuit Q with changes in center frequency $f_0$ due to adjusting the resistor 18 may be seen in FIG. 2, where for a grounded resistor 18 a substantially linear curve labeled m=0 is shown. As can be seen, as the center frequency is adjusted from $f_0$ to $Kf_0$, Q increases proportionately.

Figure 3A:
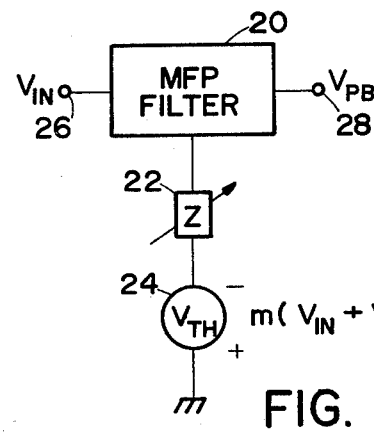
FIGS. 3A and B show respectively a Thevenin voltage source and equivalent Norton current source for connection to a multiple-feedback-path filter having a single variable-impedance tuning element.
Figure 2:
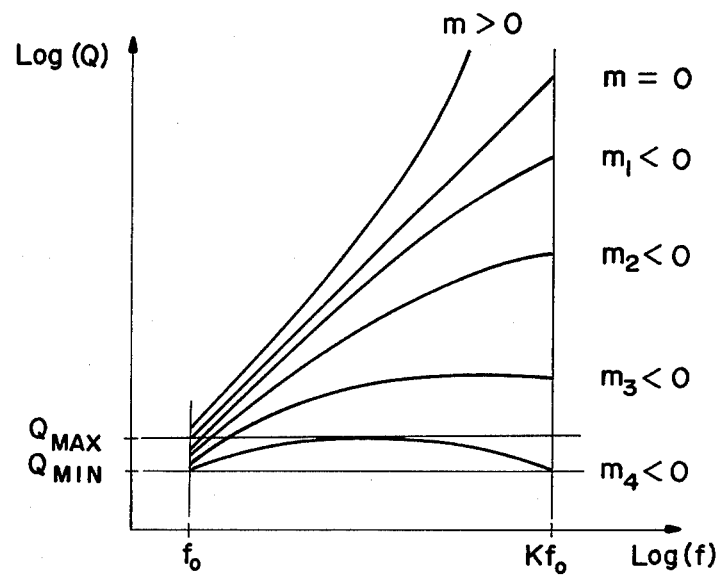
FIG. 2 shows several plots of Q factor versus frequency in connection with the present invention.

It has been found that a nearly constant Q may be achieved by placing a Thevenin equivalent voltage source in series with the variable impedance tuning element, wherein the Thevenin equivalent voltage source is a predetermined constant fractional amplitude of the bandreject output voltage, or its equivalent. This is illustrated in FIG. 3A, wherein a multiple-feedback path (MFP) filter 20, which is substantially the same as represented by bandpass filter 12 of FIG. 1, has a single variable-impedance tuning element 22 connected in series with a suitable $V_{TH}$ voltage source 24. Since the bandreject output voltage $V_{BR}$ is the summation of input signal voltage $V_{IN}$ and bandpass filter output signal voltage $V_{BP}$, the Thevenin equivalent voltage source $V_{TH}$ may be derived from the signals at input terminal 26 and output terminal 28, and may be represented as $V_{TH}=mV_{BR}=m(V_{IN}+V_{BP})$, wherein the coefficient m depends upon the exact nature of the particular filter used and the filter's starting design and characteristics, and may be determined qualitatively for a particular frequency range as shown by the curves of FIG. 2. For values of m<0, Q exhibits less change as the value of m is decreased until a curve such as that represented by $m_4$ is reached.

Figure 3B:
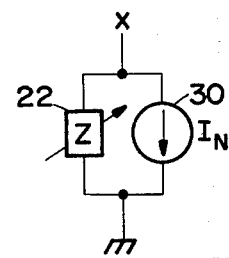

While the present invention has been built and tested using a Thevenin equivalent voltage source in series with the impedance element 22, it is presumed that a Norton equivalent current source 30 in parallel with the impedance element 22 would work equally as well. This arrangement is shown in FIG. 3B.

Figure 4A:
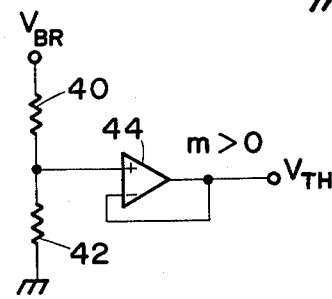
FIGS. 4A through 4C illustrate representative examples of Thevenin equivalent voltage sources.
Figure 4B:
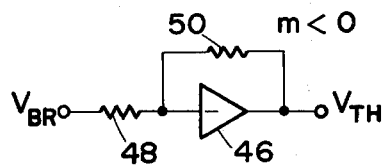
Figure 4C:
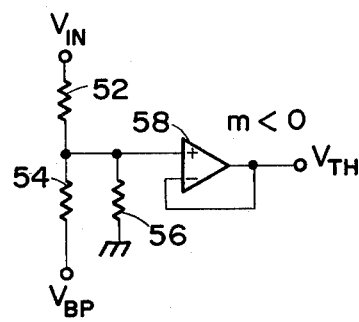

FIGS. 4A through 4C show various embodiments for providing the Thevenin equivalent voltage $V_{TH}$. In FIG. 4A, the bandreject voltage $V_{BR}$ is applied via a voltage divider network comprising resistors 40 and 42 to a voltage follower amplifier 44. This provides a positive value of $V_{TH}$, resulting in the m>0 curve shown in FIG. 2. In FIG. 4B, the bandreject voltage $V_{BR}$ is applied to an inverting operational amplifier comprising amplifier 46 and input and feedback resistors 49 and 50 respectively. This configuration provides the desired negative value of $V_{TH}$, and depending upon the ratio of input and feedback resistors utilized, Q may be represented by any of the curves $m_1$ through $m_4$ shown in FIG. 2. In FIG. 4C, the input signal voltage $V_{IN}$, bandpass signal voltage $V_{BP}$, and ground are applied via a voltage divider network comprising resistors 52, 54, and 56 to a voltage follower amplifier 58, wherein the resistor values are chosen to provide a negative value of $V_{TH}$ so that Q may be represented by any of the $m_1$ through $m_4$ curves shown in FIG. 2. Of course, the ideal situation is that in which Q is represented by the m curve.

Figure 5:
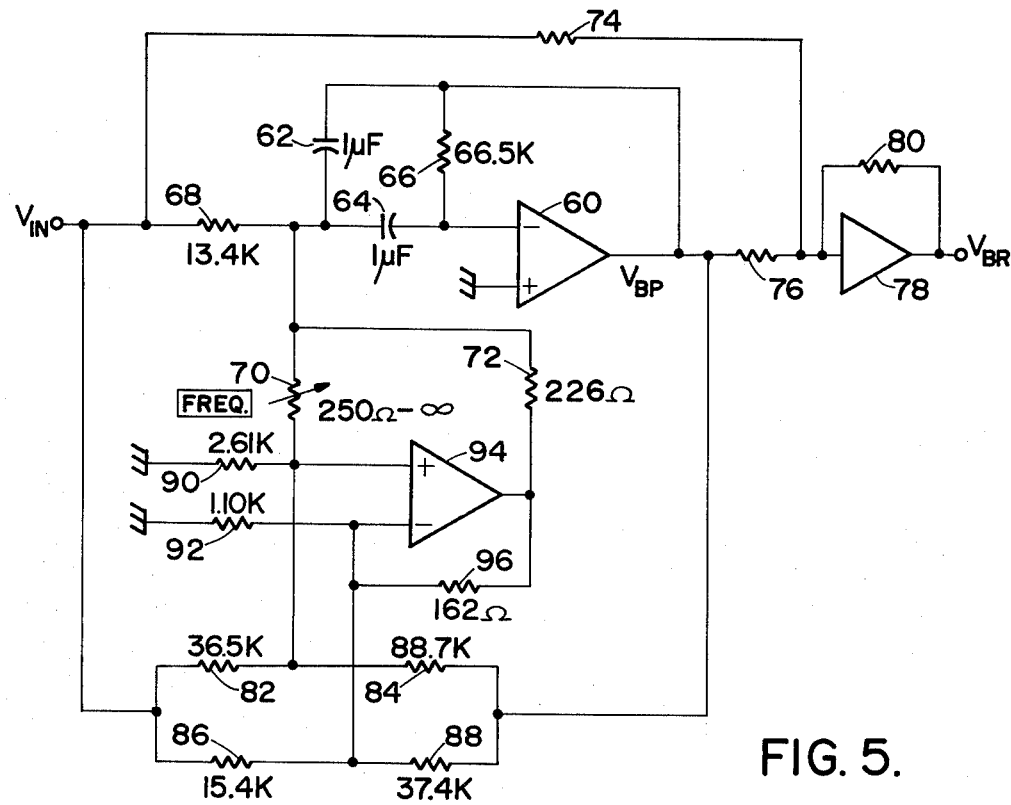
FIG. 5 shows a commercial embodiment of a bandpass/bandreject filter in accordance with the present invention.

A commercial embodiment of a bandpass filter employing a Thevenin equivalent voltage source in accordance with the present invention is that shown in FIG. 5. Because of the qualitative derivation of the value of m ($V_{IN}+V_{BP}$), actual component values are shown. The bandpass filter comprises amplifier 60, capacitors 62 and 64, and resistors 66, 68, 70, and 72, wherein resistor 70 is the single variable-impedance tuning element. For bandreject, or notch filter operation, the input voltage $V_{IN}$ and bandpass filter output signal voltage $V_{BP}$ are applied via input resistors 74 and 76 respectively to an operational amplifier comprising amplifier 78 and feedback resistor 80, which are operated as a summing amplifier.

The Thevenin equivalent voltage source is of the type shown in FIG. 4C, and comprises voltage divider resistors 82 through 92 together with operational amplifier 94 and its feedback resistor 96.

For this embodiment, frequency tuning occurs in half-decade steps so that for the frequency range $f_0$ to $Kf_0$, $K \approx 3.2$. Referring again to the $m_4$ curve shown in FIG. 2, where $m_4$ is optimally chosen for minimum variation, the relationship between $Q_{max}$, $Q_{min}$, and K is defined mathematically as $$\frac{Q_{max}}{Q_{min}} = \frac{\sqrt{K}}{2}\left(1 + \frac{1}{K}\right). \quad (1)$$

Therefore, for this embodiment, the maximum variation in Q is held to a ratio of 1.174, which is about ±8.4% referenced to the average over the frequency band. For most practical purposes, this is a nearly constant Q.

A further benefit of this circuit is that noise contributions of amplifier 60 and tuning resistor 70 are also substantially reduced, as suggested by the reduction in Q when m is optimally selected as a negative value. Where low distortion is important, this is particularly useful in establishing optimum signal levels.

While I have shown and described the preferred embodiments of my invention, it will be apparent to those skilled in the art that many changes and modifications may be made without departing from my invention in its broader aspects.

What I claim as being novel is:

1. A multiple feedback path filter comprising in combination:
   an operational amplifier having a plurality of feedback paths from output to input, said feedback paths including one or more impedance elements;
   a single variable-impedance tuning element connected to said operational amplifier; and
   means for applying a voltage to said variable-impedance tuning element to effect a nearly constant Q over a predetermined frequency range.

2. A filter in accordance with claim 1 wherein said filter is an active RC bandpass filter, and said voltage applying means comprises a Thevenin equivalent voltage source which is a predetermined combination of the input signal voltage and the bandpass output signal voltage of said filter.

3. A filter in accordance with claim 2 wherein said Thevenin equivalent voltage source comprises a voltage divider connected between the filter input and output.

4. A filter in accordance with claim 1 wherein said filter is an active RC bandpass/bandreject filter, and said voltage applying means comprises a Thevenin equivalent voltage source which is a predetermined constant fractional amplitude of the bandreject output signal voltage.

* * * * *